(12) United States Patent
Lim et al.

(10) Patent No.: US 10,325,891 B1
(45) Date of Patent: Jun. 18, 2019

(54) FAN-OUT SEMICONDUCTOR PACKAGE AND PACKAGE ON PACKAGE INCLUDING THE SAME

(71) Applicant: SAMSUNG ELECTRO-MECHANICS CO., LTD., Suwon-Si, Gyeonggi-Do (KR)

(72) Inventors: Jae Hyun Lim, Suwon-Si (KR); Han Kim, Suwon-Si (KR); Eun Jung Jo, Suwon-Si (KR); Jung Ho Shim, Suwon-Si (KR); Sang Jong Lee, Suwon-Si (KR); Hyung Joon Kim, Suwon-Si (KR)

(73) Assignee: Samsung Electro-Mechanics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/962,577

(22) Filed: Apr. 25, 2018

(30) Foreign Application Priority Data

Dec. 15, 2017  (KR) .................. 10-2017-0173409

(51) Int. Cl.
*H01L 23/49* (2006.01)
*H01L 23/04* (2006.01)
(Continued)

(52) U.S. Cl.
CPC ........ *H01L 25/105* (2013.01); *H01L 23/3128* (2013.01); *H01L 23/49811* (2013.01);
(Continued)

(58) Field of Classification Search
CPC ........... H01L 23/3128; H01L 23/49811; H01L 23/49822; H01L 23/49827;
(Continued)

(56) References Cited

U.S. PATENT DOCUMENTS 8,810,024 B2 * 8/2014 Lin .................. H01L 23/13
257/698
8,941,222 B2 * 1/2015 Hunt .................. H01L 21/565
257/678

(Continued)

FOREIGN PATENT DOCUMENTS

KR      10-1679485 B1    11/2016
KR   10-2017-0121671 A   11/2017
TW      201232723 A1     8/2012

OTHER PUBLICATIONS

Taiwanese Office Action dated Jan. 28, 2019 issued in Taiwanese Patent Application No. 107114874 (with English translation).

*Primary Examiner* — Dao H Nguyen
(74) *Attorney, Agent, or Firm* — Morgan, Lewis & Bockius LLP

(57) ABSTRACT

The fan-out semiconductor package includes: a metal member including a metal plate having a first through-hole and second through-holes and metal posts disposed in the second through-holes; a semiconductor chip disposed in the first through-hole; an encapsulant covering at least portion of each of the metal member and the semiconductor chip and filling at least portions of each of the first and second through-holes; a wiring layer disposed on the encapsulant; first vias electrically connecting the wiring layer and the connection pads to each other; and second vias electrically connecting the wiring layer and the metal posts to each other, wherein a height of the second vias is greater than that of the first vias or a thickness of the metal plate is the same as that of the metal post.

20 Claims, 14 Drawing Sheets

(51) Int. Cl.
*H01L 23/62* (2006.01)
*H01L 23/538* (2006.01)
*H01L 25/10* (2006.01)
*H01L 23/31* (2006.01)
*H01L 23/498* (2006.01)
*H01L 25/065* (2006.01)

(52) U.S. Cl.
CPC .. *H01L 23/49822* (2013.01); *H01L 23/49827* (2013.01); *H01L 23/49838* (2013.01); *H01L 25/0657* (2013.01); *H01L 2225/1058* (2013.01)

(58) Field of Classification Search
CPC ............ H01L 23/49838; H01L 25/105; H01L 25/0657; H01L 21/565; H01L 21/568
USPC ....... 257/532, 668, 686, 692, 698, 737, 779, 257/E23.011, E23.013, E23.141, E23.174, 257/E31.12, E31.113, E31.128, E21.499, 257/E21.503, E21.508, E21.511; 174/260, 263; 361/761, 764; 438/108, 438/121, 666, 667
See application file for complete search history.

(56) References Cited

U.S. PATENT DOCUMENTS

| | | | |
|---|---|---|---|
| 9,852,998 B2 * | 12/2017 | Chen | H01L 21/4803 |
| 10,109,588 B2 * | 10/2018 | Jeong | H01L 23/5389 |
| 2008/0099912 A1 * | 5/2008 | Wu | H01L 23/142 257/737 |
| 2010/0006330 A1 * | 1/2010 | Fu | H01L 21/486 174/260 |
| 2010/0032827 A1 * | 2/2010 | Hsu | H01L 23/5383 257/692 |
| 2012/0126388 A1 | 5/2012 | Lin et al. | |
| 2012/0217049 A1 * | 8/2012 | Hanai | H05K 1/185 174/260 |
| 2015/0255432 A1 | 9/2015 | Lin et al. | |
| 2016/0322332 A1 | 11/2016 | Kim et al. | |
| 2017/0040265 A1 | 2/2017 | Park et al. | |
| 2017/0263573 A1 | 9/2017 | Kim et al. | |
| 2017/0287825 A1 | 10/2017 | Lee et al. | |
| 2017/0309571 A1 | 10/2017 | Yi et al. | |

* cited by examiner

FAN-OUT SEMICONDUCTOR PACKAGE AND PACKAGE ON PACKAGE INCLUDING THE SAME

CROSS-REFERENCE TO RELATED APPLICATION(S)

This application claims the benefit of priority to Korean Patent Application No. 10-2017-0173409 filed on Dec. 15, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package capable of being applied to a package-on-package (POP) structure.

BACKGROUND

Thinness and lightness of semiconductors tend to be continuously demanded in a semiconductor market, and since it is desired by consumers that products consuming a low amount of battery power and having a smaller size be supplied at low cost, semiconductor manufacturers have attempted to continuously reduce sizes of chips and packages. To this end, fan-out package technology, a manner of performing signal connection using a redistribution layer (RDL) when packaging a semiconductor chip, has been actively developed, and technology of applying such a fan-out package to a package-on-package structure has been actively developed. However, in accordance with thinning of a lower fan-out package applied to a package-on-package, a defect of solder joints due to warpage of the lower package occurring at the time of stacking an upper package on the lower package has increased.

SUMMARY

An aspect of the present disclosure may provide a fan-out semiconductor package of which warpage is effectively controlled and which is easily applied to a package-on-package, and a package-on-package including the same.

According to an aspect of the present disclosure, a fan-out semiconductor package may be manufactured by introducing a metal member including a metal plate and metal posts into a core region and disposing a semiconductor chip in a through-hole of the metal member, and a packaging process may be performed by introducing the metal member to an interposer manufactured in advance.

According to an aspect of the present disclosure, a fan-out semiconductor package may include: a metal member including a metal plate having a first through-hole and second through-holes smaller than the first through-hole and metal posts disposed in the second through-holes to be spaced apart from the metal plate; a semiconductor chip disposed in the first through-hole and having an active surface having connection pads disposed thereon and an inactive surface opposing the active surface; an encapsulant covering at least a portion of each of the metal member and the active surface of the semiconductor chip and filling at least portions of each of the first and second through-holes; a wiring layer disposed on the encapsulant; first vias penetrating through at least portions of the encapsulant and electrically connecting the wiring layer and the connection pads to each other; second vias penetrating through at least portions of the encapsulant and electrically connecting the wiring layer and the metal posts to each other; and a connection member disposed on the encapsulant to cover the wiring layer and including a redistribution layer electrically connected to the connection pads through the wiring layer, wherein a height of the second vias is greater than that of the first vias. The fan-out semiconductor package may further include an interposer disposed on the metal member and the inactive surface of the semiconductor chip and including an interposer wiring layer electrically connected to the connection pads through the metal posts and the wiring layer.

According to another aspect of the present disclosure, a fan-out semiconductor package may include: a metal member including a metal plate having a first through-hole and second through-holes smaller than the first through-hole and metal posts disposed in the second through-holes to be spaced apart from the metal plate; a semiconductor chip disposed in the first through-hole and having an active surface having connection pads disposed thereon and an inactive surface opposing the active surface; an encapsulant covering at least a portion of each of the metal member and the active surface of the semiconductor chip and filling at least portions of each of the first and second through-holes; a wiring layer disposed on the encapsulant and electrically connected to the metal posts and the connection pads; and a connection member disposed on the encapsulant to cover the wiring layer and including a redistribution layer electrically connected to the connection pads through the wiring layer, wherein a thickness of the metal plate is the same as that of the metal post. An interposer including an interposer wiring layer electrically connected to the connection pads through the metal posts and the wiring layer may be disposed on the metal member and the inactive surface of the semiconductor chip.

According to another aspect of the present disclosure, a package-on-package may include: a first semiconductor package including a metal member including a metal plate having a first through-hole and second through-holes smaller than the first through-hole and metal posts disposed in the second through-holes to be spaced apart from the metal plate, a first semiconductor chip disposed in the first through-hole and having an active surface having connection pads disposed thereon and an inactive surface opposing the active surface, a first encapsulant covering at least portion of each of the metal member and the active surface of the first semiconductor chip and filling at least portions of each of the first and second through-holes, a wiring layer disposed on the first encapsulant, first vias penetrating through at least portions of the first encapsulant and electrically connecting the wiring layer and the connection pads to each other, second vias penetrating through at least portions of the first encapsulant and electrically connecting the wiring layer and the metal posts to each other, a connection member disposed on the first encapsulant to cover the wiring layer and including a redistribution layer electrically connected to the connection pads through the wiring layer, and an interposer disposed on the metal member and the inactive surface of the first semiconductor chip and including an interposer wiring layer electrically connected to the connection pads through the metal posts and the wiring layer; and a second semiconductor package including a wiring member disposed on the interposer of the first semiconductor package and including a wiring member wiring layer electrically connected to the interposer wiring layer through electrical connection structures, a second semiconductor chip disposed on the wiring member and electrically connected to the wiring member wiring layer, and a second encapsulant disposed on the wiring member and encapsulating at least portions of the second semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
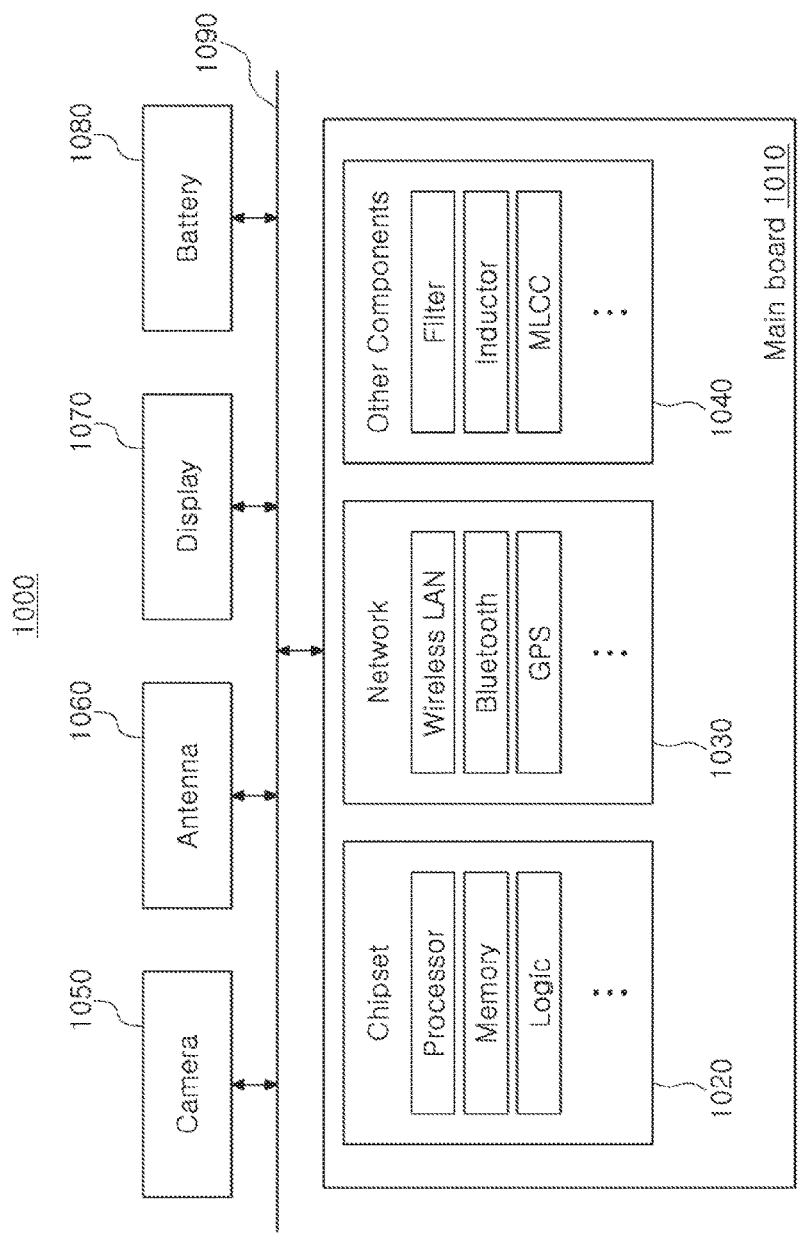
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip-related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
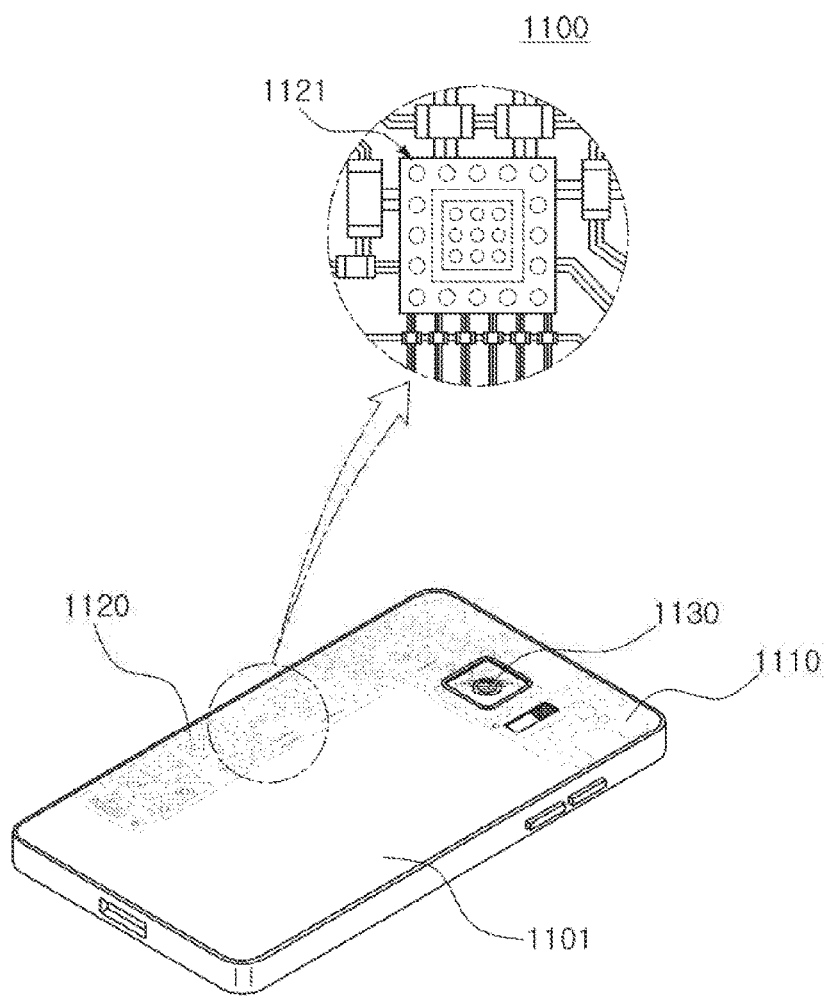
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various components 1120 may be physically or electrically connected to the mainboard 1110. In addition, other components that may or may not be physically or electrically connected to the mainboard 1110, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required, due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
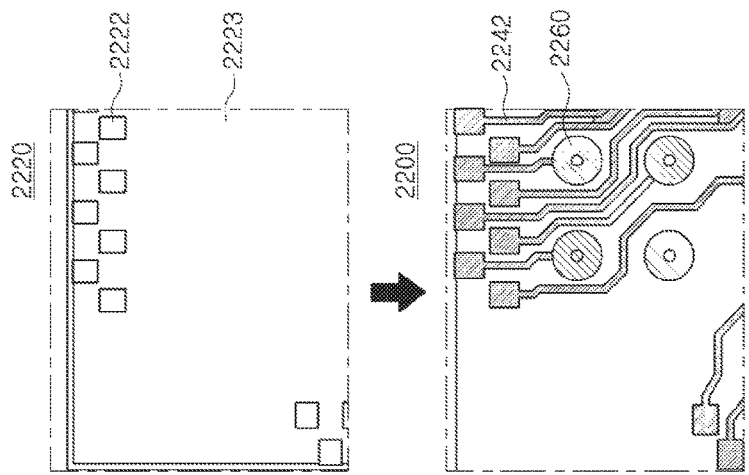
FIGS. 3A and 3B are schematic cross-sectional views illustrating states of a fan-in semiconductor package before and after being packaged.
Figure 3A:
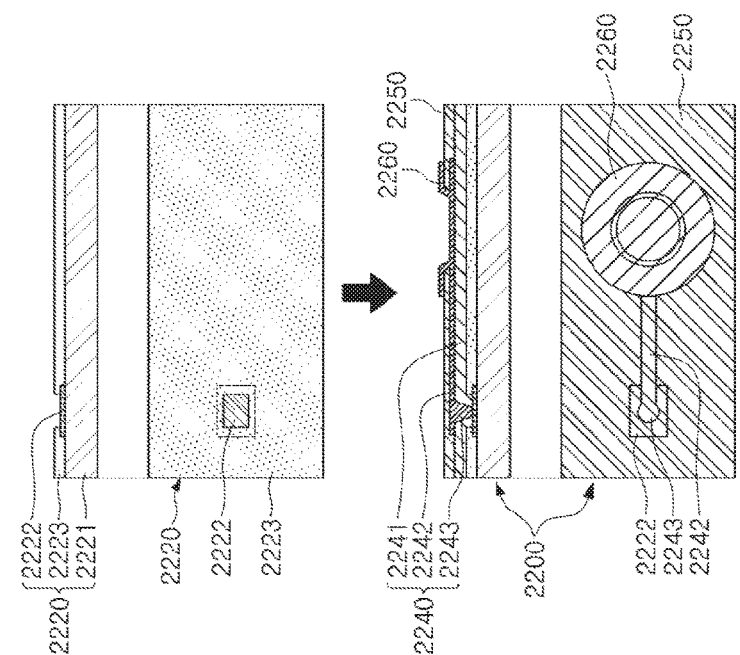

FIGS. 3A and 3B are schematic cross-sectional views illustrating states of a fan-in semiconductor package before and after being packaged.

Figure 4:
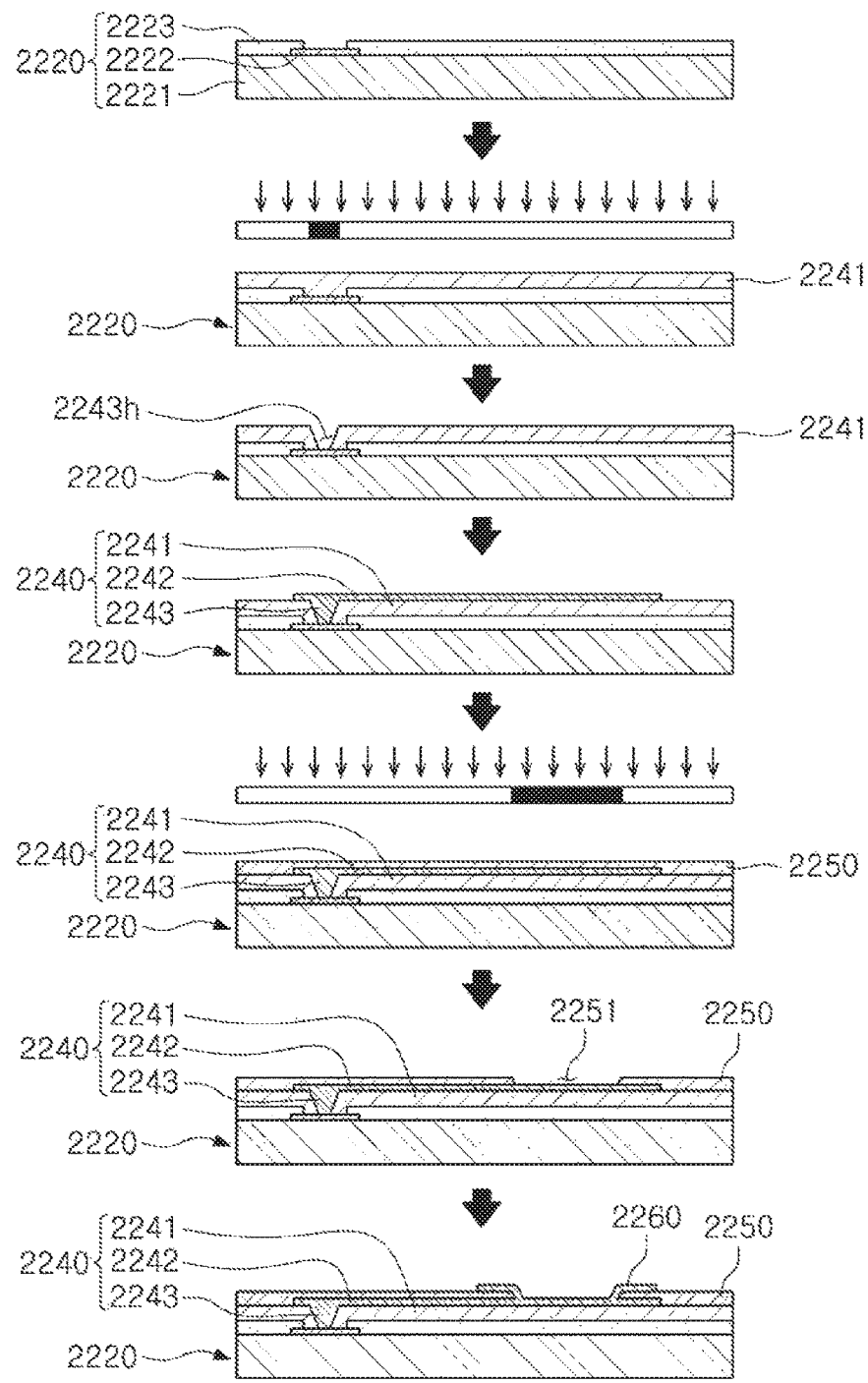
FIG. 4 is schematic cross-sectional views illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and may be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
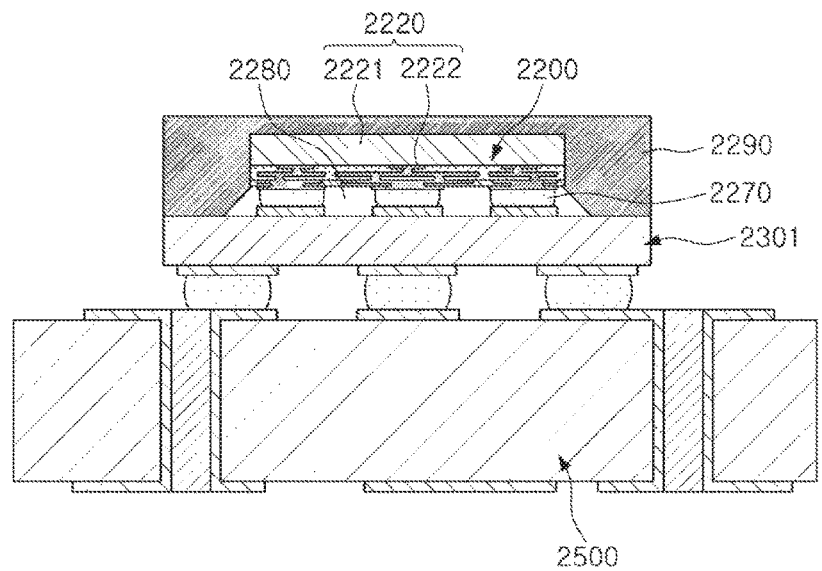
FIG. 5 is a schematic cross-sectional view illustrating a case in which a fan-in semiconductor package is mounted on a ball grid array (BGA) substrate and is finally mounted on a main board of an electronic device.

FIG. 5 is a schematic cross-sectional view illustrating a case in which a fan-in semiconductor package is mounted on an interposer substrate and is ultimately mounted on a mainboard of an electronic device.

Figure 6:
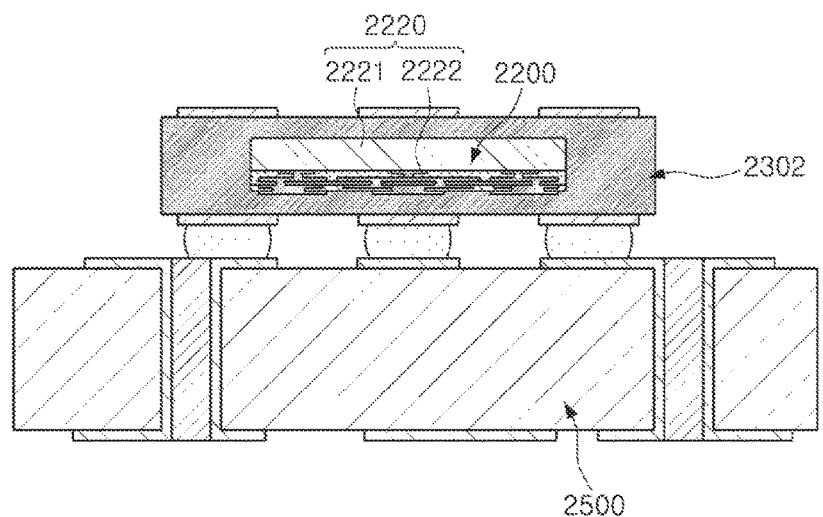
FIG. 6 is a schematic cross-sectional view illustrating a case in which a fan-in semiconductor package is embedded in a BGA substrate and is finally mounted on a main board of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and may be then mounted on the mainboard of the electronic device through a packaging process or may be mounted and used on the mainboard of the electronic device in a state in which it is embedded in the interposer substrate.

Fan-Out Semiconductor Package

Figure 7:
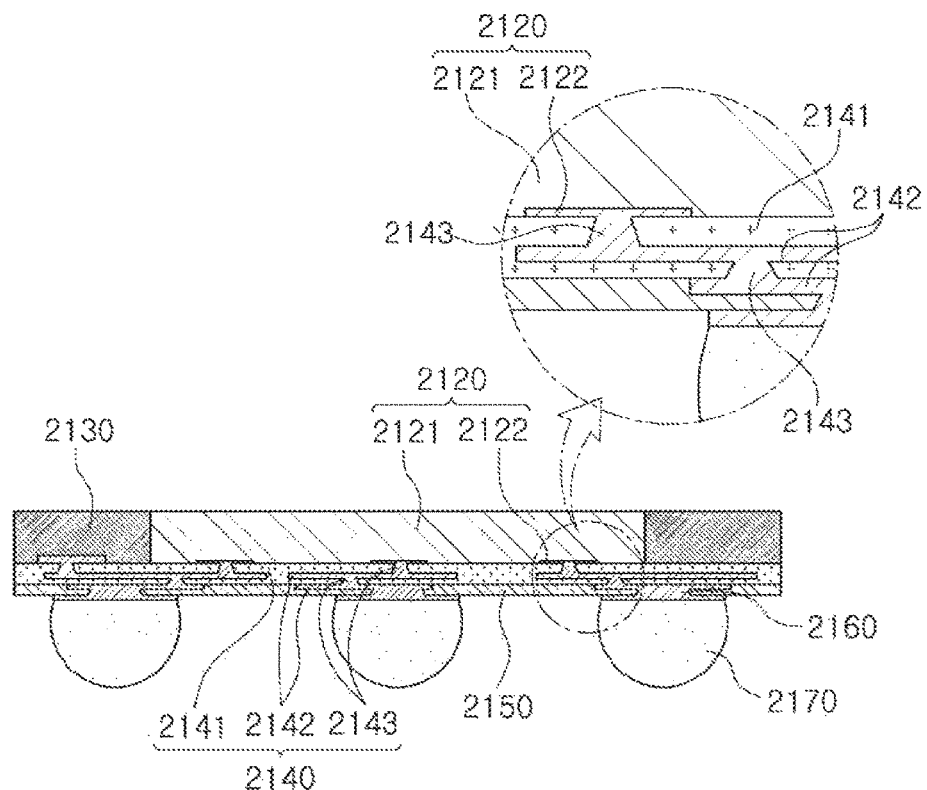
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
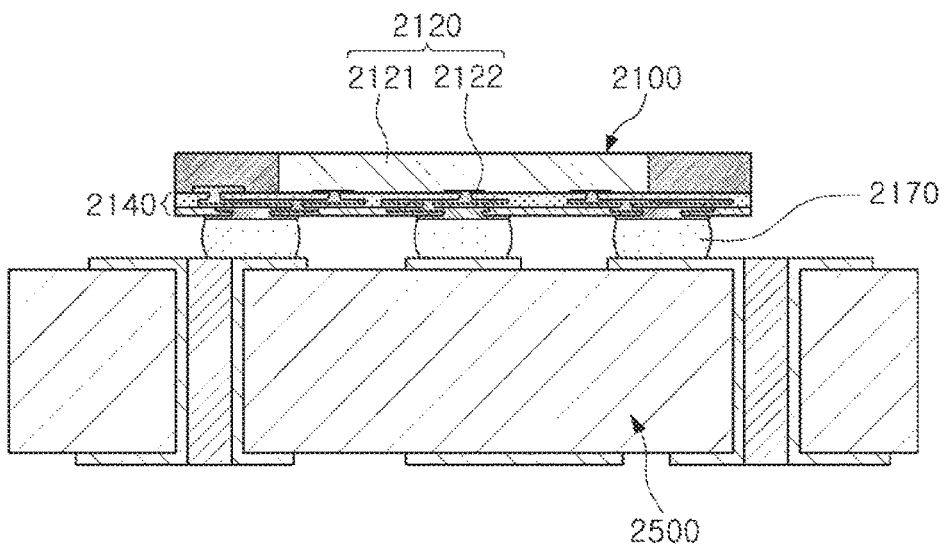
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that a standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package of which warpage is effectively controlled and which is easily applied to a package-on-package will hereinafter be described with reference to the drawings.

Figure 9:
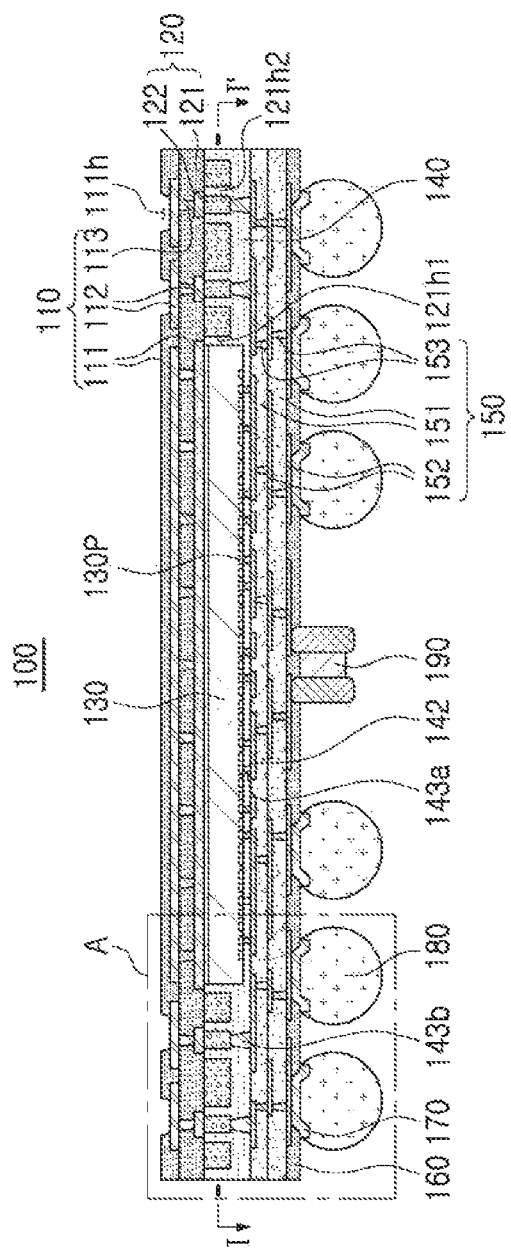
FIG. 9 is a schematic cross-sectional view illustrating an example of a fan-out semiconductor package.

FIG. 9 is a schematic cross-sectional view illustrating an example of a fan-out semiconductor package.

Figure 10:
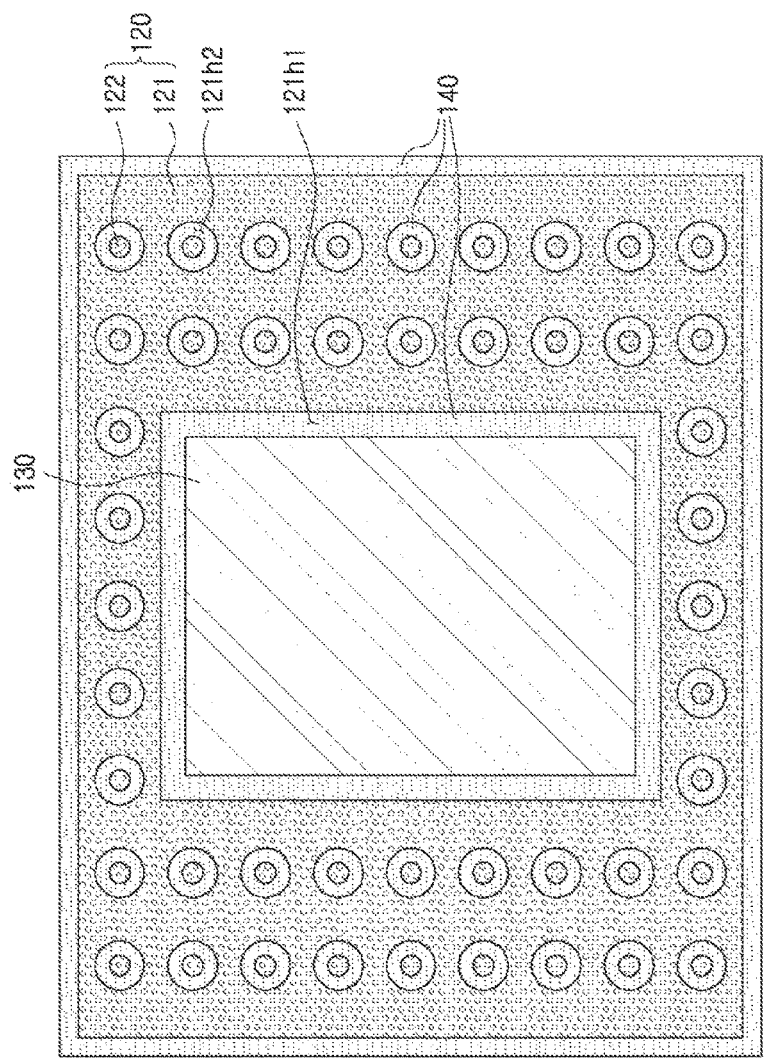
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Figure 11:
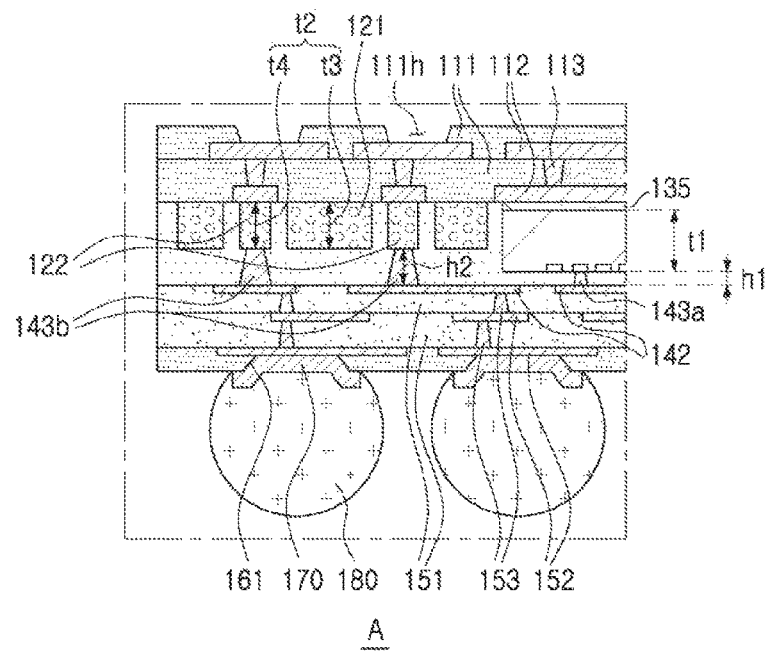
FIG. 11 is a schematic enlarged cross-sectional view illustrating region A of the fan-out semiconductor package of FIG. 9.

FIG. 11 is a schematic enlarged cross-sectional view illustrating region A of the fan-out semiconductor package of FIG. 9.

Referring to FIGS. 9 through 11, a fan-out semiconductor package 100 according to an exemplary embodiment in the present disclosure may include a metal member 120 including a metal plate 121 having a first through-hole 121$h$1 and second through-holes 121$h$2 smaller than the first through-hole 121$h$1 and metal posts 122 disposed in the second through-holes 121$h$2 to be spaced apart from the metal plate 121, a semiconductor chip 130 disposed in the first through-hole 121$h$1 and having an active surface having connection pads 130P disposed thereon and an inactive surface opposing the active surface, an encapsulant 140 covering at least a portion of each of the metal member 120 and the active surface of the semiconductor chip 130 and filling at least portions of each of the first and second through-holes 121$h$1 and 121$h$2, a wiring layer 142 disposed on the encapsulant 140, first vias 143$a$ penetrating through at least portions of the encapsulant 140 and electrically connecting the wiring layer 142 and the connection pads 130P to each other, second vias 143$b$ penetrating through at least portions of the encapsulant 140 and electrically connecting the wiring layer 142 and the metal posts 122 to each other, and a connection member 150 disposed on the encapsulant 140 to cover the wiring layer 142 and including a redistribution layer 152 electrically connected to the connection pads 130P through the wiring layer 142.

In addition, the fan-out semiconductor package 100 according to the exemplary embodiment may further include an interposer 110 disposed on the metal member 120 and the inactive surface of the semiconductor chip 130 and including an interposer wiring layer 112 electrically connected to the connection pads 130P through the metal posts 122 and the wiring layer 142, a passivation layer 160 disposed on the other surface of the connection member 150 opposing the surface of the connection member 150 on which the encapsulant 140 is disposed and having openings 161 exposing at least portions of the redistribution layer 152, an underbump metal layer 170 disposed in the openings 161 of the passivation layer 160 and electrically connected to the exposed redistribution layer 152, and electrical connection structures 180 disposed on the other surface of the passivation layer 160 opposing one surface of the passivation layer 160 on which the connection member 150 is disposed and electrically connected to the exposed redistribution layer 152 through the underbump metal layer 170. If necessary, a surface mounted component 190 electrically connected to the redistribution layer 152 of the connection member 150 may be disposed on the passivation layer 160.

As described above, thinness and lightness of semiconductors tend to be continuously demanded in a semiconductor market, and since it is desired by consumers that products consuming a low amount of battery power and having a smaller size be supplied at low cost, semiconductor manufacturers have attempted to continuously reduce sizes of chips and packages. To this end, fan-out package technology, which is a manner of performing signal connection using a redistribution layer when packaging a semiconductor chip, has been actively developed, and technology of applying such a fan-out package to a package-on-package structure has been actively developed. However, in accordance with thinness of a lower fan-out package applied to a package-on-package, a defect of solder joints due to warpage of the lower package occurring at the time of stacking an upper package on the lower package has increased.

On the other hand, the fan-out semiconductor package 100 according to the exemplary embodiment may have a structure in which the metal member 120 including the metal plate 121 and the metal posts 122 are introduced in a core region and the semiconductor chip 130 is disposed in the first through-hole 121$h$1 of the metal member 120. Therefore, warpage of the fan-out semiconductor package 100 may be reduced because of the metal member 120. Particularly, when a photoimagable encapsulant (PIE) is used as a material of the encapsulant 140, a portion vulnerable to warpage may be generated due to a section in which a coefficient of thermal expansion (CTE) is high in the vicinity of the semiconductor chip 130, but may be controlled by the metal member 120. In addition, the metal posts 122 may be disposed in the second through-holes 121$h$2 of the metal member 120 to be spaced apart from the metal plate 121, and since the metal post 122 are used as paths for a signal connection, a package-on-package signal connection may be easy in spite of introduction of the metal member 120. Since a packaging process is performed by introducing the metal member 120 described above onto the interposer 110 manufactured in advance, a decrease in a yield due to a defect of the interposer 110 may be prevented, and the fan-out semiconductor package 100 may be more effectively applied to a package-on-package by introducing the interposer 110.

The respective components included in the fan-out semiconductor package 100 according to an exemplary embodiment will hereinafter be described in more detail.

The interposer 110 may be configured to allow the fan-out semiconductor package 100 according to the exemplary embodiment to be easily applied to a package-on-package structure. The interposer 110 may include interposer insulating layers 111, interposer wiring layers 112 formed on the interposer insulating layers 111, and interposer vias 113 formed in the interposer insulating layers 111. The interposer 110 may also include insulating layers 111, wiring layers 112, and vias 113 of which the numbers are greater than those illustrated in the drawings. The interposer 110 may be manufactured in advance as described below, and a phenomenon in which a defect of the interposer 110 has an influence on a yield of the semiconductor chip 130, or the like, may be prevented.

A material of the interposer insulating layer 111 is not particularly limited. For example, an insulating material may be used as the material of the interposer insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a photoimagable dielectric (PID) resin may be used, and a solder resist (SR) may be used as the outermost layer of the interposer insulating layer 111. Openings 111h exposing at least portions of the interposer wiring layer 112 may be formed in the other surface of the interposer 110, more specifically, the interposer insulating layer 111, opposing one surface of the interposer 110, more specifically, the interposer insulating layer 111, on which the metal member 120 and the semiconductor chip 130 are disposed, and electrical connection structures (not illustrated) may be disposed in the openings 111h and may be utilized as a package-on-package connection.

Each of the interposer wiring layers 112 may include a conductive material such as copper (Cu), aluminum (Al), silver (Ag), tin (Sn), gold (Au), nickel (Ni), lead (Pb), titanium (Ti), or alloys thereof. The interposer wiring layers 112 may perform various functions depending on designs of the corresponding layers. For example, the interposer wiring layers 112 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the interposer wiring layers 112 may include via pads, wire pads, electrical connection structure pads, and the like. The interposer wiring layers 112 may be electrically connected to the connection pads 130P of the semiconductor chip 130 through the metal post 122, the wiring layer 142, and the like.

The interposer vias 113 may electrically connect the interposer wiring layers 112 formed on different layers to each other, resulting in an electrical path in the interposer 110. The same conductive material as that of the interposer wiring layer 112 described above may be used as a material of each of the interposer vias 113. Each of the interposer vias 113 may be completely filled with the conductive material, or the conductive material may be formed along a wall of each of via holes. Each of the interposer vias 113 may have a tapered cross-sectional shape of which a direction is different from that of redistribution vias 153 to be described below because of the process by which the respective vias are formed, but is not limited thereto.

The metal member 120 may control the warpage of the fan-out semiconductor package 100 according to the exemplary embodiment. In addition, an electrical connection path between upper and lower components of the fan-out semiconductor package 100 according to the exemplary embodiment may be provided through the metal member 120. The metal member 120 may include the metal plate 121 and the metal posts 122. The metal plate 121 may have the first through-hole 121h1 and the second through-holes 121h2 smaller than the first through-hole 121h1. The semiconductor chip 130 may be disposed in the first through-hole 121h1. The metal posts 122 may be disposed in the second through-holes 121h2 to be spaced apart from the metal plate 121 by predetermined distances and isolated from the metal plate 121. The first through-hole 121h1 may be formed in a central portion of the metal plate 121, that is, approximately in a fan-in region, and the second through-holes 121h2 may be formed in an outer portion of the metal plate 121, that is, approximately a fan-out region. A plurality of second through-holes 121h2 may be formed in the vicinity of the first through-hole 121h1, and the metal posts 122 may be disposed in the plurality of second through-holes 121h2, respectively. The metal posts 122 may be connected to the second vias 143b, respectively.

The metal plate 121 may serve to substantially reduce the warpage of the fan-out semiconductor package 100. The metal plate 121 may include a metal such as copper (Cu), but is not limited thereto. That is, the metal plate 121 may include another metal such as aluminum (Al), silver (Ag), tin (Sn), gold (Au), nickel (Ni), lead (Pb), titanium (Ti), or alloys thereof. The metal plate 121 may be used as a ground (GND) pattern and/or a power (PWR) pattern for the semiconductor chip 130 as described below, or may be used as a dummy pattern, if necessary.

The metal posts 122 may provide an electrical connection path between upper and lower components of the fan-out semiconductor package 100. The fan-out semiconductor package 100 may be easily applied to the package-on-package structure through the metal posts 122. The metal posts 122 may also include a metal such as copper (Cu), but are not limited thereto. That is, the metal posts 122 may include another metal such as aluminum (Al), silver (Ag), tin (Sn), gold (Au), nickel (Ni), lead (Pb), titanium (Ti), or alloys thereof. The metal posts 122 may include the same material as that of the metal plate 121. The metal posts 122 may be used as signal connection paths, but are not limited thereto. The metal posts 122 may be indirect contact with at least portions of an interposer wiring layer 112 embedded in the interposer insulating layer 111.

The semiconductor chip 130 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphics processor (for example, a GPU), a field programmable gate array (FPGA), a digital signal processor, a cryptographic processor, a microprocessor, a micro controller, or the like, but is not limited thereto. The inactive surface of the semiconductor chip 130 may be attached to the interposer 110 through the known adhesion member 135 such as a die attach film (DAF), or the like.

The semiconductor chip 130 may be formed on the basis of an active wafer. In this case, a base material of a body 131 may be silicon (Si), germanium (Ge), gallium arsenide (GaAs), or the like. Various circuits may be formed on the body. The connection pads 130P may electrically connect the semiconductor chip 130 to other components. A material of each of the connection pads 130P may be a conductive material such as aluminum (Al), or the like. A passivation layer (not illustrated) exposing the connection pads 130P may be formed on the body, and may be an oxide film, a nitride film, or the like, or a double layer of an oxide layer and a nitride layer. An insulating layer (not illustrated), and the like, may also be further disposed in other required positions. The semiconductor chip 130 may be a bare die. Therefore, the connection pads 130P may be in physical contact with the second vias 143a. However, when the semiconductor chip 130 is not an application processor (AP), a separate redistribution layer (not illustrated) may be further formed on the active surface of the semiconductor chip 130, and bumps (not illustrated), or the like, may be connected to the connection pads 130P.

A thickness t1 of the semiconductor chip 130 may be greater than a thickness t2 of the metal member 120. When the thickness t2 of the metal member 120 is greater than the thickness t1 of the semiconductor chip 130, a problem such as non-uniformity of a thickness of the encapsulant 140 may occur, and a problem such as mismatch between coefficients of thermal expansion (CTEs) due to an excessive metal disposition may occur. Therefore, a height h1 of the first vias 143a connecting the connection pads 130P of the semiconductor chip 130 and the wiring layer 142 to each other may be smaller than a height h2 of the second vias 143b connecting the metal plate 121 of the metal member 120 and the wiring layer 142 to each other. Meanwhile, a thickness t3 of the metal plate 121 may be substantially the same as a thickness t4 of the metal post 122. That is, a surface of the metal plate 121 may be disposed on a level that is substantially the same as that of a surface of each of the metal posts 121. Here, the surface may be an upper surface or may be a lower surface. A term "same" herein conceptually includes a case in which two dimensions are finely different from each other by manufacturing tolerances, e.g., 1 µm or less, as well as a case in which two dimensions are identical to each other. In this case, the problem such as the non-uniformity of the thickness of the encapsulant 140 may be solved, and convenience of a process may be excellent.

The encapsulant 140 may protect the metal member 120, the semiconductor chip 130, and the like. An encapsulation form of the encapsulant 140 is not particularly limited, but may be a form in which the encapsulant 140 surrounds at least portions of the metal member 110 and the semiconductor chip 130. For example, the encapsulant 140 may cover at least portions of each of the metal member 120 and the active surface of the semiconductor chip 130, and fill at least portions of the first and second through-holes 121h1 and 121h2. The encapsulant 140 may fill the first and second through-holes 121h1 and 121h2 to thus serve as an adhesive and reduce buckling of the semiconductor chip 130 depending on certain materials. In addition, the encapsulant 140 may further reduce warpage by controlling a CTE. In addition, the encapsulant 140 may provide an insulating region between the metal plate 121 and the metal posts 122.

A material of the encapsulant 140 is not particularly limited. For example, an insulating material may be used as the material of the encapsulant 140. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PIE resin may be used. In this case, via holes for the first and second vias 143a and 143b may be formed by a photolithography method.

The wiring layer 142 may redistribute the connection pads 130P of the semiconductor chip 130. The wiring layer 142 may also include a conductive material such as copper (Cu), aluminum (Al), silver (Ag), tin (Sn), gold (Au), nickel (Ni), lead (Pb), titanium (Ti), or alloys thereof. The wiring layer 142 may perform various functions depending on a design. For example, the wiring layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layer 142 may include via pads, wire pads, electrical connection structure pads, and the like.

The first vias 143a may electrically connect the wiring layer 142 to the connection pads 130P of the semiconductor chip 130. The second vias 143b may electrically connect the wiring layer 142 to the metal posts 122. Each of the first and second vias 143a and 143b may include a conductive material such as copper (Cu), aluminum (Al), silver (Ag), tin (Sn), gold (Au), nickel (Ni), lead (Pb), titanium (Ti), or alloys thereof. Each of the first and second vias 143a and 143b may be entirely filled with the conductive material, or the conductive material may also be formed along a wall of each of the via holes. Each of the first and second vias 143a and 143b may have a tapered cross-sectional shape of which a direction is the same as that of redistribution vias 153 to be described below for the reason in a process, but is not limited thereto. The height h1 of the first vias 143a may be lower than the height h2 of the second vias 143b.

The connection member 150 may redistribute the connection pads 130P of the semiconductor chip 130. Several tens to several millions of connection pads 130P of the semiconductor chip 130 having various functions may be redistributed by the connection member 150, and may be physically or electrically externally connected through the electrical connection structures 180 depending on the functions. The connection member 150 may include insulating layers 151 disposed on the encapsulant 140 and covering the wiring layer 142, the redistribution layers 152 formed on the insulating layers 151, and the redistribution vias 153 formed in the insulating layers 151. Depending on a design, the connection member 150 may include insulating layers, redistribution layers, and via layers of which the numbers are less than or more than those illustrated in the drawings.

A material of each of the insulating layers 151 may be an insulating material. In this case, a photosensitive insulating material such as a PID resin may also be used as the insulating material. That is, each of the insulating layers 151 may be a photosensitive insulating layer. When the insulating layer 151 has photosensitive properties, the insulating layer 151 may be formed to have a lower thickness, and a fine pitch of the redistribution via 153 may be achieved more easily. Each of the insulating layers 151 may be a photosensitive insulating layer including an insulating resin and an inorganic filler. When the insulating layers 151 are multiple layers, materials of the insulating layers 151 may be the same as each other, and may also be different from each other, if necessary. When the insulating layers 151 are the multiple layers, the insulating layers 151 may be integrated with each other depending on a process, such that a boundary therebetween may also not be apparent.

The redistribution layers 152 may serve to substantially redistribute the connection pads 130P. A material of each of the redistribution layers 152 may be a conductive material such as copper (Cu), aluminum (Al), silver (Ag), tin (Sn), gold (Au), nickel (Ni), lead (Pb), titanium (Ti), or alloys thereof. The redistribution layers 152 may perform various functions depending on designs of their corresponding layers. For example, the redistribution layer 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 152 may include various pad patterns, and the like.

The redistribution vias 153 may electrically connect the redistribution layers 152, the wiring layer 142, and the like, formed on different layers to each other, resulting in an electrical path in the fan-out semiconductor package 100. A material of each of the redistribution vias 153 may be a conductive material such as copper (Cu), aluminum (Al), silver (Ag), tin (Sn), gold (Au), nickel (Ni), lead (Pb), titanium (Ti), or alloys thereof. Each of the redistribution vias 153 may be completely filled with the conductive material, or the conductive material may also be formed along a wall of each of the vias.

The passivation layer 160 may protect the connection member 150 from external physical or chemical damage. The passivation layer 160 may have the openings 161 exposing at least portions of the redistribution layer 152 of the connection member 150. The number of openings 161 formed in the passivation layer 160 may be several tens to several millions. A surface treatment layer (not illustrated) may be formed on a surface of the exposed redistribution layer 152. A material of the passivation layer 160 is not particularly limited. For example, an insulating material may be used as the material of the passivation layer 160. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layer 170 may improve connection reliability of the electrical connection structures 180 to improve board level reliability of the fan-out semiconductor package 100. The underbump metal layer 170 may be connected to the redistribution layer 152 of the connection member 150 exposed through the openings 161 of the passivation layer 160. The underbump metal layer 170 may be formed in the openings 161 of the passivation layer 160 by the known metallization method using the known conductive metal such as a metal, but is not limited thereto.

The electrical connection structure 180 may physically or electrically externally connect the fan-out semiconductor package 100 according to the exemplary embodiment. For example, the fan-out semiconductor package 100 may be mounted on the main board of the electronic device through the electrical connection structures 180. Each of the electrical connection structures 180 may be formed of a low melting point metal, for example, a solder such as tin (Sn)-aluminum (Al)-copper (Cu), or the like. However, this is only an example, and a material of each of the electrical connection structures 180 is not limited thereto. Each of the electrical connection structures 180 may be a land, a ball, a pin, or the like. The electrical connection structures 180 may be formed as a multilayer or single layer structure. When the electrical connection structures 180 are formed as a multilayer structure, the electrical connection structures 180 may include a copper (Cu) pillar and a solder. When the electrical connection structures 180 are formed as a single layer structure, the electrical connection structures 180 may include a tin-silver solder or copper (Cu). However, this is only an example, and the electrical connection structures 180 are not limited thereto.

The number, an interval, a disposition form, and the like, of electrical connection structures 180 are not particularly limited, but may be sufficiently modified depending on design particulars by those skilled in the art. For example, the electrical connection structures 180 may be provided in an amount of several tens to several millions according to the number of connection pads 130P, or may be provided in an amount of several tens to several millions or more or several tens to several millions or less. When the electrical connection structures 180 are solder balls, the electrical connection structures 180 may cover side surfaces of the underbump metal layer 170 extending onto one surface of the passivation layer 160, and connection reliability may be more excellent.

At least one of the electrical connection structures 180 may be disposed in a fan-out region. The fan-out region refers to a region except for a region in which the semiconductor chip 130 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The surface mounted component 190 may be a suitable passive component such as a capacitor, an inductor, a bead, or the like, but is not limited. In some case, the surface mounted component may be an integrated circuit (IC) type semiconductor chip. The surface mounted component 190 may be surface-mounted by solder bonding, or the like, and may be electrically connected to the redistribution layer 152 of the connection member 150. Therefore, the surface mounted component 190 may also be electrically connected to connection pads 130P of the semiconductor chip 130. A thickness of the surface mounted component 190 may be smaller than that of the electrical connection structure 180.

Meanwhile, although not illustrated in the drawings, a metal thin film may be formed on walls of the first through-hole 121$h$1, if necessary, in order to dissipate heat or block electromagnetic waves. In addition, a plurality of semiconductor chips 130 performing functions that are the same as or different from each other may be disposed in the first through-hole 121$h$1, if necessary. In addition, a separate passive component such as an inductor, a capacitor, or the like, may be disposed in the first through-hole 121$h$1, if necessary.

Figure 12:
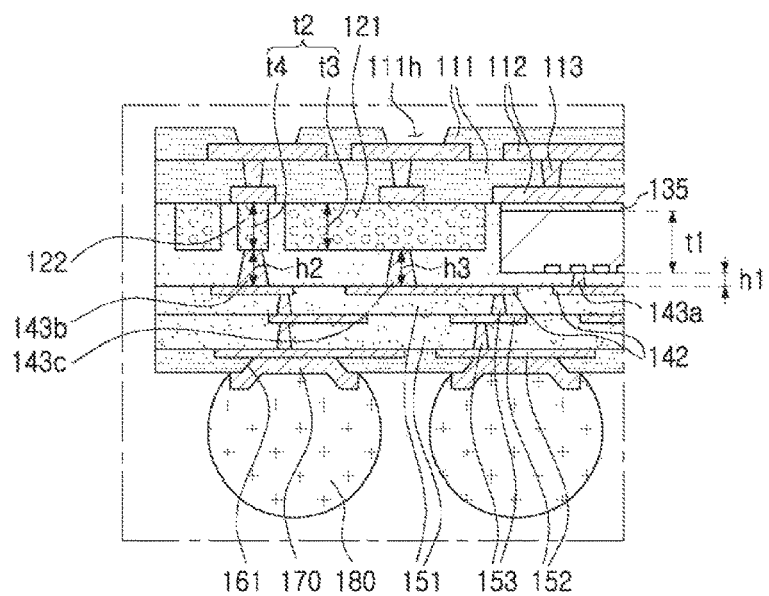
FIG. 12 is a schematic modified enlarged cross-sectional view illustrating region A of the fan-out semiconductor package of FIG. 9.

FIG. 12 is a schematic modified enlarged cross-sectional view illustrating region A of the fan-out semiconductor package of FIG. 9.

Referring to FIG. 12, the fan-out semiconductor package 100 according to the exemplary embodiment may further include third vias 143$c$ penetrating through at least portion of the encapsulant 140 and connecting the wiring layer 142 and the metal plate 121 to each other. In this case, a height of the third vias 143$c$ may be greater than that of the first vias 143$a$, and may be the same as that of the second vias 143$b$. In this case, the metal plate 121 may be in direct contact with at least portions of each of the interposer insulating layer 111 and the interposer wiring layer 112 embedded in the interposer insulating layer 111 so that one surface thereof is exposed. That is, the metal plate 121 may also be electrically connected to the interposer wiring layer 112 and the wiring layer 142, and may be electrically connected to the connection pads 130P. The metal plate 121 may serve power (PWR) and/or ground (GND) patterns of the semiconductor chip 130. In this case, the metal plate 121 may be electrically connected to power (PWR) and/or ground (GND) patterns of the interposer wiring layer 112 and the wiring layer 142, and may be electrically connected to connection pads 130 for power (PWR) and/or ground (GND) among the connection pads 130P. Descriptions of other configurations overlap that described above, and are thus omitted.

Figure 13:
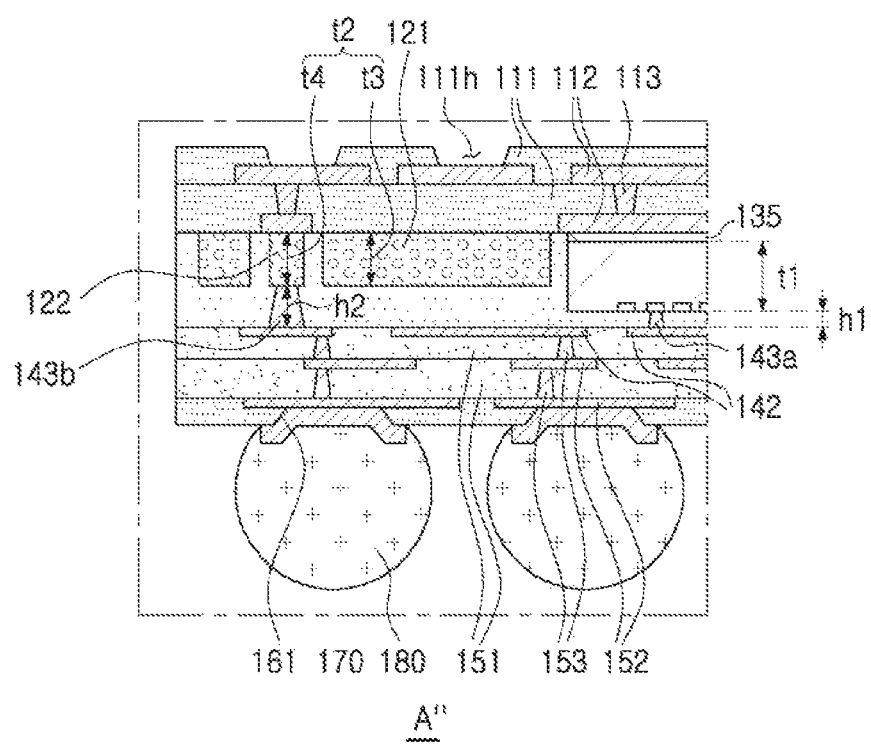
FIG. 13 is another schematic modified enlarged cross-sectional view illustrating region A of the fan-out semiconductor package of FIG. 9.

FIG. 13 is another schematic modified enlarged cross-sectional view illustrating region A of the fan-out semiconductor package of FIG. 9.

Referring to FIG. 13, in the fan-out semiconductor package 100 according to the exemplary embodiment, the metal plate 121 may be a dummy pattern. That is, the metal plate 121 may be electrically insulated from the interposer wiring layer 112 and the wiring layer 142, and may be electrically insulated from the connection pads 130P. Meanwhile, in some cases, the metal plate 121 may include a plurality of units physically spaced apart from each other. In this case, some of the plurality of units may be dummy patterns, as described above, and the others of the plurality of units may be ground (GND) and/or power (PWR) patterns. Descriptions of other configurations overlap that described above, and are thus omitted.

Figure 14:
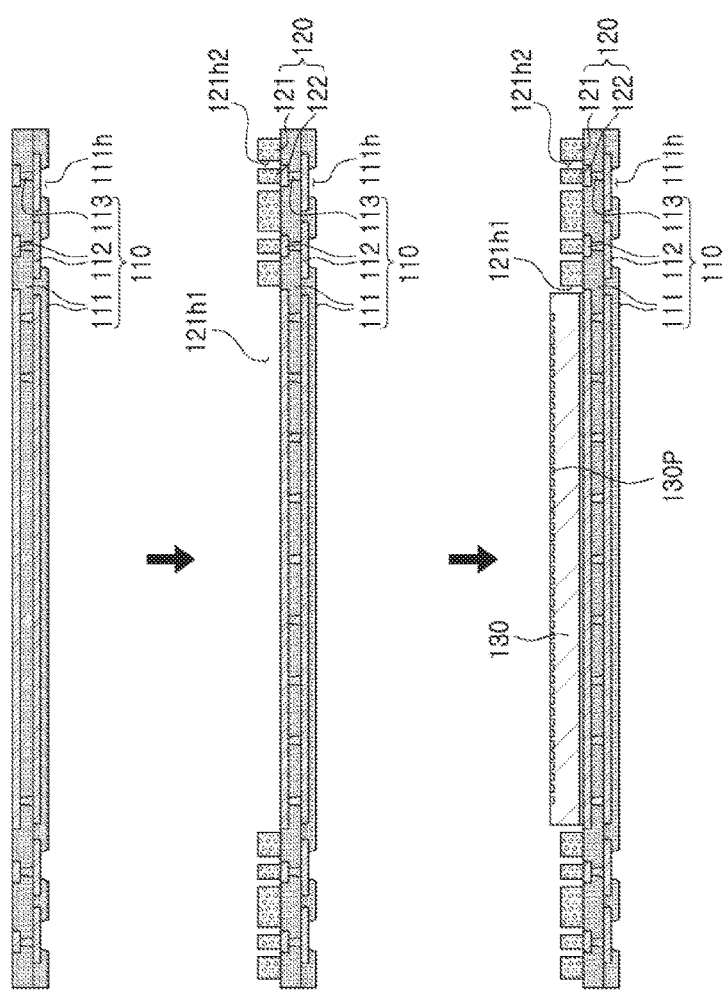
FIGS. 14 through 16 are schematic views illustrating an example of processes of manufacturing the fan-out semiconductor package of FIG. 9.
Figure 15:
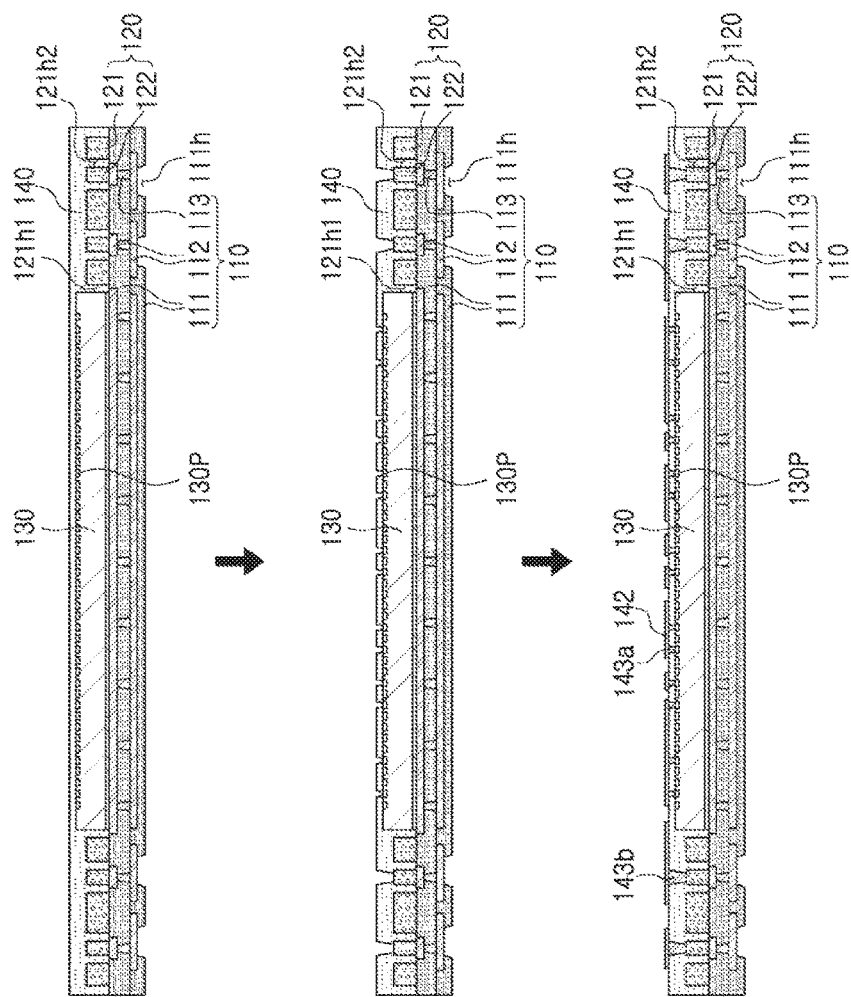
Figure 16:
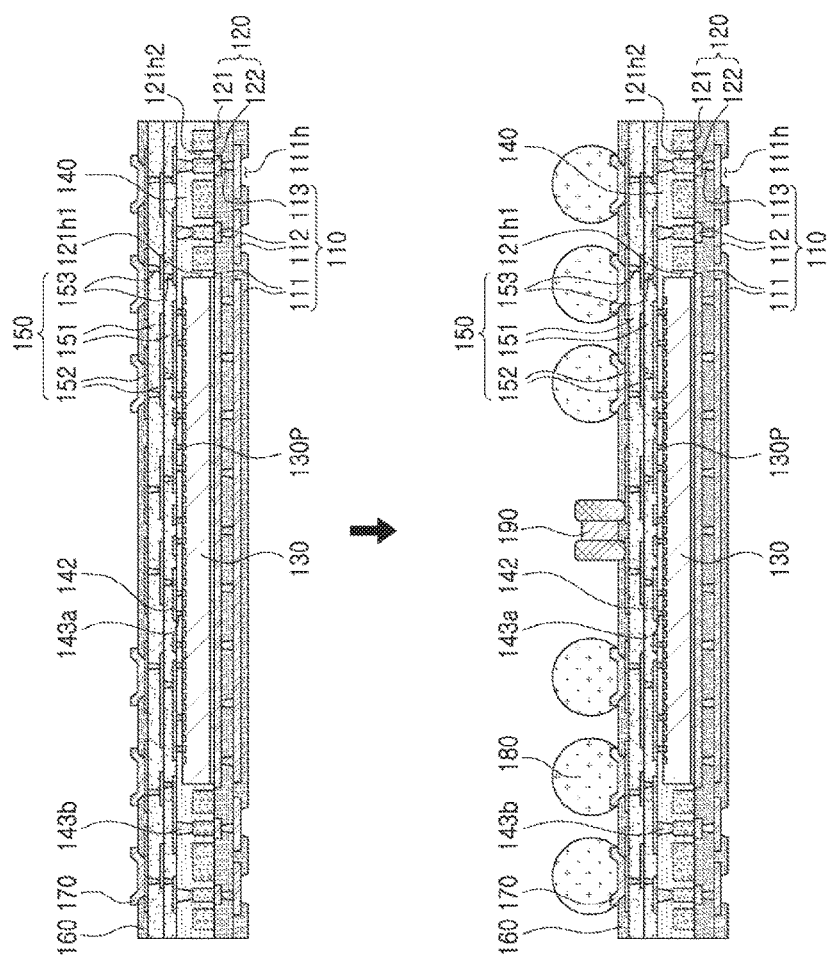

FIGS. 14 through 16 are schematic views illustrating an example of a process of manufacturing the fan-out semiconductor package of FIG. 9.

Referring to FIG. 14, the interposer 110 may be first prepared. The interposer 110 may be manufactured in advance. Therefore, even though a defect occurs in a process of manufacturing the interposer 110, it may not have an influence on a yield of the semiconductor chip 130. Then, the metal member 120 may be formed on the interposer 110. The metal member 120 may be formed by a suitable plating process. In this case, the metal plate 121 and the metal posts 122 may be patterned and divided, and the first and second through-holes 121h1 and 121h2 may be formed in this process. Then, the inactive surface of the semiconductor chip 130 may be attached to the interposer 110 exposed through the first through-hole 121h1 of the metal plate 121 using the adhesion member 135, or the like. Meanwhile, the inactive surface of the semiconductor chip 130 may be attached to a region of the interposer 110 in which the interposer wiring layer 112 is formed, resulting in promotion of a heat dissipation effect. That is, portions of each of the interposer wiring layer 112 and the interposer vias 113 may be formed for the purpose of heat dissipation of the semiconductor chip 130.

Then, referring to FIG. 15, at least portions of each of the metal member 120 and the semiconductor chip 130 may be encapsulated using the encapsulant 140. In detail, the encapsulant may encapsulate at least portions of the metal member 120 and the active surface of the semiconductor chip 130, and fill at least portions of each of the first and second through-holes 121h1 and 121h2. The encapsulant 140 may be formed by applying and hardening a PIE or may be formed by laminating and hardening a film form. Then, via holes for the first and second vias 143a and 143b may be formed in the encapsulant 140 by a photolithography method, or the like, and may be filled by plating to form the first and second vias 143a and 143b. In addition, in such a plating process, the wiring layer 142 may also be formed. The plating process may be the known plating process such as an additive method, a semi-additive method, a modified semi-additive method, a tenting method, or the like, but is not limited thereto.

Then, referring to FIG. 16, the connection member 150, the passivation layer 160, and the underbump metal layer 170 may be sequentially formed on the encapsulant 140. The connection member 150 may be formed by repeating processes of forming the insulating layer 151 by applying a PID, or the like, forming via holes by a photolithography method, and the redistribution layer 152 and the redistribution vias 153 by plating. The passivation layer 160 may be formed by a suitable lamination and hardening method or applying and hardening method. The underbump metal layer 170 may be formed by a suitable metallization method. Then, the electrical connection structures 180 connected to the underbump metal layer 170 may be formed on the passivation layer 160. The electrical connection structures 180 may be formed by a reflow process. In addition, the surface mounted component 190 electrically connected to the redistribution layer 152 of the connection member 150 may be disposed on the passivation layer 160. The fan-out semiconductor package 100 according to the exemplary embodiment described above may be manufactured through a series of processes. The series of processes may be performed on a large area panel level. In this case, a plurality of fan-out semiconductor packages 100 may be manufactured by performing processes one time. Resultantly, the plurality of fan-out semiconductor packages 100 may be obtained by a sawing process.

Package-On-Package

Figure 17:
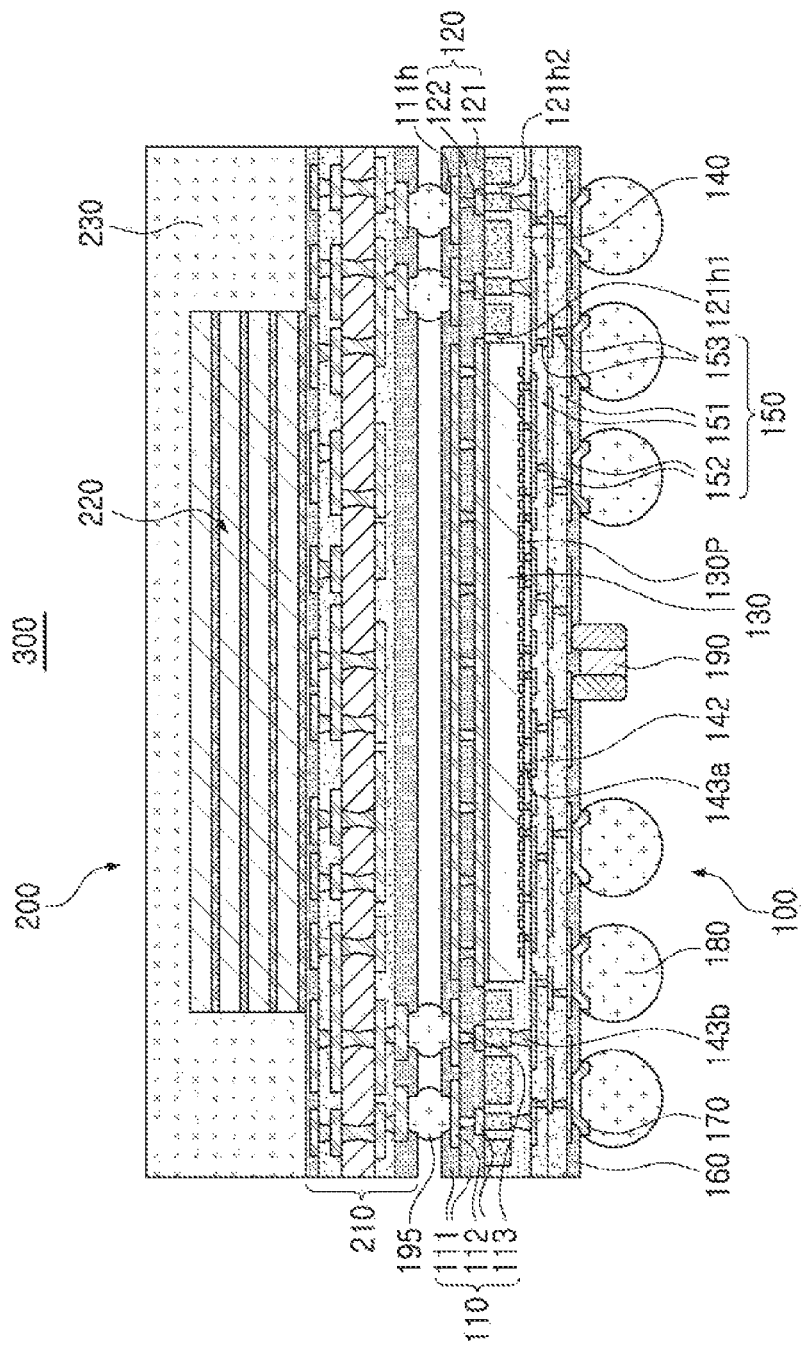
FIG. 17 is a schematic cross-sectional view illustrating an example of a package-on-package.

FIG. 17 is a schematic cross-sectional view illustrating an example of a package-on-package.

Referring to FIG. 17, a package-on-package 300 according to an exemplary embodiment in the present disclosure may include the fan-out semiconductor package 100 according to the exemplary embodiment described above and another semiconductor package 200 stacked on the fan-out semiconductor package 100. The semiconductor package 200 may include a wiring member 210 disposed on the interposer 110 of the fan-out semiconductor package 100 according to the exemplary embodiments described above and including a wiring member wiring layer (not denoted by a reference numeral) electrically connected to the interposer wiring layer 112 through electrical connection structures 195, a semiconductor chip 220 disposed on the wiring member 210 and electrically connected to the wiring member wiring layer (not denoted by a reference numeral), and an encapsulant 230 disposed on the wiring member 210 and encapsulating at least portions of the semiconductor chip 220.

Each of the electrical connection structures 195 may be formed of a low melting point metal, for example, a solder such as tin (Sn)-aluminum (Al)-copper (Cu), or the like. However, this is only an example, and a material of each of the electrical connection structures 195 is not limited thereto. Each of the electrical connection structures 195 may be a land, a ball, a pin, or the like. The electrical connection structures 195 may be formed as a multilayer or single layer structure. When the electrical connection structures 195 are formed as a multilayer structure, the electrical connection structures 195 may include a copper (Cu) pillar and a solder. When the electrical connection structures 195 are formed as a single layer structure, the electrical connection structures 195 may include a tin-silver solder or copper (Cu). However, this is only an example, and the electrical connection structures 195 are not limited thereto. The electrical connection structures 195 may be formed in the openings 111h of the interposer 110, and may be connected to at least portions of the interposer wiring layer 112 exposed through the openings 111h. In addition, the electrical connection structures 195 may be formed in openings (not denoted by a reference numeral) of the wiring member 210, and may be connected to at least portions of a wiring member wiring layer (not denoted by a reference numeral) exposed through the openings (not denoted by a reference numeral). The number of electrical connection structures 195 is not particularly limited, and may be formed in a fan-in region as well as a fan-out region unlike FIG. 17.

The wiring member 210 may have a form of a suitable interposer substrate including an insulating layer, a wiring layer, and vias, but is not limited thereto. The semiconductor chip 220 may be a memory such as a volatile memory (such as a DRAM), a non-volatile memory (such as a ROM), a flash memory, or the like, but is not limited thereto. The semiconductor chip 220 may have a form in which a plurality of memories (not denoted by a reference numeral) are stacked, and the respective memories may be electrically connected to each other through through-silicon-vias (TSVs) (not illustrated), but are not limited thereto, and the respective memories may be electrically connected to the wiring member 210 and the wiring member wiring layer (not denoted by a reference numeral) through wiring bonding (not illustrated). The encapsulant 230 may be formed of the same material as that of the encapsulant 140 described above or may be formed of a general molding material.

In the package-on-package 300 according to the exemplary embodiment, the fan-out semiconductor package 100 according to the exemplary embodiments described above is used as a lower package, such that rigidity of the lower package may be increased and warpage of the lower package is thus reduced, and a signal connection between the semiconductor chips 130 and 220, for example, a high input/output (I/O) signal connection between an application processor and a memory may be easy.

As set forth above, according to the exemplary embodiment in the present disclosure, a fan-out semiconductor package of which warpage is effectively controlled and which is easily applied to a package-on-package, and a package-on-package including the same may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a metal member including a metal plate having a first through-hole and second through-holes smaller than the first through-hole and metal posts disposed in the second through-holes, the metal posts being spaced apart from the metal plate;
a semiconductor chip disposed in the first through-hole and having an active surface having connection pads disposed thereon and an inactive surface opposing the active surface;
an encapsulant covering at least portion of each of the metal member and the active surface of the semiconductor chip and filling at least portions of each of the first and second through-holes;
a wiring layer disposed on the encapsulant;
first vias penetrating through at least portions of the encapsulant and electrically connecting the wiring layer and the connection pads to each other; and
second vias penetrating through at least portions of the encapsulant and electrically connecting the wiring layer and the metal posts to each other,
wherein a height of the second vias is greater than that of the first vias.

2. The fan-out semiconductor package of claim 1, further comprising a connection member disposed on the encapsulant to cover the wiring layer and including a redistribution layer electrically connected to the connection pads through the wiring layer.

3. The fan-out semiconductor package of claim 2, further comprising an interposer disposed on the metal member and the inactive surface of the semiconductor chip and including an interposer wiring layer electrically connected to the connection pads through the metal posts and the wiring layer.

4. The fan-out semiconductor package of claim 3, wherein the inactive surface of the semiconductor chip is attached to the interposer through an adhesion member.

5. The fan-out semiconductor package of claim 3, wherein at least portions of the interposer wiring layer are in direct contact with the metal posts.

6. The fan-out semiconductor package of claim 3, wherein interposer vias of the interposer and redistribution vias of the connection member have tapered cross-sectional shapes of which directions are opposite to each other.

7. The fan-out semiconductor package of claim 3, wherein openings exposing at least portions of the interposer wiring layer are formed in a surface of the interposer opposing a surface of the interposer on which the metal member and the semiconductor chip are disposed.

8. The fan-out semiconductor package of claim 3, further comprising third vias penetrating through at least portions of the encapsulant and connecting the wiring layer and the metal plate to each other,
wherein a height of the third vias is greater than that of the first vias, and
the height of the third vias is the same as that of the second vias.

9. The fan-out semiconductor package of claim 8, wherein at least portions of the interposer wiring layer are in direct contact with the metal plate.

10. The fan-out semiconductor package of claim 8, wherein the metal plate is a power (PWR) or ground (GND) pattern of the semiconductor chip.

11. The fan-out semiconductor package of claim 2, further comprising:
a passivation layer disposed on a surface of the connection member opposing a surface of the connection member on which the encapsulant is disposed and having openings exposing at least portions of the redistribution layer;
an underbump metal layer disposed in the openings of the passivation layer and electrically connected to the exposed redistribution layer; and
electrical connection structures disposed on the other surface of the passivation layer opposing one surface of the passivation layer on which the connection member is disposed and electrically connected to the exposed redistribution layer through the underbump metal layer.

12. The fan-out semiconductor package of claim 1, wherein a thickness of the semiconductor chip is greater than that of the metal member.

13. The fan-out semiconductor package of claim 1, wherein a thickness of the metal plate is the same as that of the metal post.

14. The fan-out semiconductor package of claim 13, wherein a surface of the metal plate is disposed on the same level as that of a surface of the metal post.

15. The fan-out semiconductor package of claim 1, wherein more than one of second through-holes is formed in a fan-out region of the metal plate,
the metal posts are disposed in the second through-holes, and
the metal posts are connected to the second vias.

16. The fan-out semiconductor package of claim 1, wherein the metal plate is a dummy pattern electrically insulated from the wiring layer.

17. The fan-out semiconductor package of claim 1, wherein the encapsulant includes a photoimagable encapsulant (PIE).

18. A fan-out semiconductor package comprising:
a metal member including a metal plate having a first through-hole and second through-holes smaller than the first through-hole and metal posts disposed in the second through-holes, the metal posts being spaced apart from the metal plate;
a semiconductor chip disposed in the first through-hole and having an active surface having connection pads disposed thereon and an inactive surface opposing the active surface, the semiconductor chip being spaced apart from the metal plate;
an encapsulant covering at least portion of each of the metal member and the active surface of the semiconductor chip and filling a space between the first through-hole and the semiconductor chip and between the second through-holes and the metal posts; and
a wiring layer disposed on the encapsulant and electrically connected to the metal posts and the connection pads,
wherein a thickness of the metal plate is the same as that of the metal post.

19. The fan-out semiconductor package of claim 18, further comprising a connection member disposed on the encapsulant to cover the wiring layer and including a redistribution layer electrically connected to the connection pads through the wiring layer.

20. A package-on-package comprising:
a first semiconductor package including
a metal member including a metal plate having a first through-hole and second through-holes smaller than the first through-hole and metal posts disposed in the second through-holes to be spaced apart from the metal plate,
a first semiconductor chip disposed in the first through-hole and having an active surface having connection pads disposed thereon and an inactive surface opposing the active surface,
a first encapsulant covering at least portion of each of the metal member and the active surface of the first semiconductor chip and filling at least portions of each of the first and second through-holes,
a wiring layer disposed on the first encapsulant,
first vias penetrating through at least portions of the first encapsulant and electrically connecting the wiring layer and the connection pads to each other,
second vias penetrating through at least portions of the first encapsulant and electrically connecting the wiring layer and the metal posts to each other,
a connection member disposed on the first encapsulant to cover the wiring layer and including a redistribution layer electrically connected to the connection pads through the wiring layer, and
an interposer disposed on the metal member and the inactive surface of the first semiconductor chip and including an interposer wiring layer electrically connected to the connection pads and the redistribution layer through the metal posts and the wiring layer; and
a second semiconductor package including a wiring member disposed on the interposer of the first semiconductor package and including a wiring member wiring layer electrically connected to the interposer wiring layer through electrical connection structures,
a second semiconductor chip disposed on the wiring member and electrically connected to the wiring member wiring layer, and
a second encapsulant disposed on the wiring member and encapsulating at least portions of the second semiconductor chip.

\* \* \* \* \*